(12) United States Patent
Liu et al.

(10) Patent No.: US 11,688,808 B2
(45) Date of Patent: Jun. 27, 2023

(54) TRANSISTOR AND METHODS OF FORMING INTEGRATED CIRCUITRY

(71) Applicant: Micron Technology, Inc., Boise, ID (US)

(72) Inventors: Hung-Wei Liu, Meridian, ID (US); Sameer Chhajed, Boise, ID (US); Jeffery B. Hull, Boise, ID (US); Anish A. Khandekar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 17/317,674

(22) Filed: May 11, 2021

(65) Prior Publication Data

US 2021/0265502 A1 Aug. 26, 2021

Related U.S. Application Data

(62) Division of application No. 16/536,590, filed on Aug. 9, 2019, now Pat. No. 11,024,736.

(51) Int. Cl.
*H01L 29/78* (2006.01)
*H01L 29/66* (2006.01)
*H01L 21/02* (2006.01)
*H01L 29/04* (2006.01)
*H10B 12/00* (2023.01)

(52) U.S. Cl.
CPC .... *H01L 29/7841* (2013.01); *H01L 21/02686* (2013.01); *H01L 29/04* (2013.01); *H01L 29/66666* (2013.01); *H01L 29/7827* (2013.01); *H10B 12/20* (2023.02)

(58) Field of Classification Search
CPC .......... H01L 29/7841; H01L 21/02686; H01L 29/04; H01L 29/66666; H01L 29/7827; H01L 21/02513; H01L 21/02532; H01L 21/02595; H01L 27/1285; H01L 21/0245; H01L 29/78642; H01L 29/66833; H01L 29/1029; H01L 29/792; H10B 12/20
See application file for complete search history.

(56) References Cited

U.S. PATENT DOCUMENTS

| 6,617,644 B1 | 9/2003 | Yamazaki et al. |
| 8,034,671 B2 | 10/2011 | Peng et al. |
| 2002/0052069 A1 | 5/2002 | Jiroku |

(Continued)

FOREIGN PATENT DOCUMENTS

| EP | 0901169 | 3/1999 |
| EP | 20852322.5 | 9/2022 |

(Continued)

*Primary Examiner* — Victor A Mandala
(74) *Attorney, Agent, or Firm* — Wells St. John P.S.

(57) ABSTRACT

A transistor comprises a top source/drain region, a bottom source/drain region, a channel region vertically between the top and bottom source/drain regions, and a gate operatively laterally-adjacent the channel region. At least one of the top source/drain region, the bottom source/drain region, and the channel region are crystalline. All crystal grains within the at least one of the top source/drain region, the bottom source/drain region, and the channel region have average crystal sizes within 0.064 μm³ of one another. Other embodiments, including methods, are disclosed.

13 Claims, 6 Drawing Sheets

(56) References Cited

U.S. PATENT DOCUMENTS

| | | |
|---|---|---|
| 2003/0003766 A1* | 1/2003 | Kumomi ........... H01L 21/02667 |
| | | 438/760 |
| 2003/0102508 A1 | 6/2003 | Lee |
| 2003/0211666 A1 | 11/2003 | Okumura |
| 2004/0152269 A1 | 8/2004 | Hergenrother et al. |
| 2005/0020096 A1 | 1/2005 | Miyairi et al. |
| 2005/0255679 A1 | 11/2005 | Yamaguchi et al. |
| 2006/0141684 A1 | 6/2006 | Peng et al. |
| 2006/0177361 A1* | 8/2006 | Kumomi ............ H01L 27/1296 |
| | | 422/245.1 |
| 2009/0269892 A1 | 10/2009 | Hatano et al. |
| 2009/0321737 A1 | 12/2009 | Isa et al. |
| 2010/0044702 A1 | 2/2010 | Urayama et al. |
| 2010/0163821 A1* | 7/2010 | Ohashi ............... G11C 13/0007 |
| | | 257/E29.327 |
| 2011/0017990 A1 | 1/2011 | Son et al. |
| 2012/0100675 A1 | 4/2012 | Komatsu et al. |
| 2012/0217500 A1 | 8/2012 | Park et al. |
| 2013/0056742 A1 | 3/2013 | Tezuka et al. |
| 2013/0126869 A1* | 5/2013 | Kanegae ................. H01L 29/04 |
| | | 257/66 |
| 2013/0143395 A1 | 6/2013 | Shieh et al. |
| 2014/0141579 A1* | 5/2014 | Tian ................... B23K 26/0734 |
| | | 438/166 |
| 2014/0225184 A1 | 8/2014 | Colinge et al. |
| 2014/0264353 A1* | 9/2014 | Lai ......................... H10B 69/00 |
| | | 438/266 |
| 2015/0044833 A1 | 2/2015 | Lee et al. |
| 2015/0084043 A1* | 3/2015 | Ishihara .............. H01L 27/1225 |
| | | 257/43 |
| 2015/0340631 A1 | 11/2015 | Rinzler et al. |
| 2016/0099250 A1 | 4/2016 | Rabkin et al. |
| 2016/0284765 A1 | 9/2016 | Takeguchi et al. |
| 2017/0033175 A1 | 2/2017 | Oda et al. |
| 2017/0062466 A1* | 3/2017 | Ishizaki ................. H10B 43/27 |
| 2017/0077125 A1 | 3/2017 | Yamasaki et al. |
| 2017/0082902 A1 | 3/2017 | Hirose |
| 2017/0235201 A1 | 8/2017 | Hirose |
| 2019/0279913 A1* | 9/2019 | Gluschenkov ........ H01L 29/161 |
| 2020/0066513 A1* | 2/2020 | Nahar ............... H01L 21/02422 |
| 2020/0303543 A1* | 9/2020 | Cheng ............... H01L 21/76834 |
| 2020/0312849 A1* | 10/2020 | Cheng ............... H01L 29/66795 |
| 2020/0335601 A1* | 10/2020 | Liu .................... H01L 21/02255 |
| 2020/0395238 A1* | 12/2020 | Cheng ................. H01L 29/0649 |

FOREIGN PATENT DOCUMENTS

| | | |
|---|---|---|
| JP | 4583529 | 11/2010 |
| WO | WO 97/45827 | 12/1997 |
| WO | WO PCT/US2020/043708 | 11/2020 |
| WO | WO PCT/US2020/043708 | 2/2022 |

\* cited by examiner

TRANSISTOR AND METHODS OF FORMING INTEGRATED CIRCUITRY

RELATED PATENT DATA

This patent resulted from a divisional application of U.S. patent application Ser. No. 16/536,590, filed Aug. 9, 2019, entitled "Transistor And Methods Of Forming Integrated Circuitry", naming Hung-Wei Liu, Sameer Chhajed, Jeffery B. Hull, and Anish A. Khandekar as inventors, the disclosure of which is incorporated by reference.

TECHNICAL FIELD

Embodiments disclosed herein pertain to transistors and to methods of forming integrated circuitry.

BACKGROUND

Memory is one type of integrated circuitry and is used in computer systems for storing data, Memory may be fabricated in one or more arrays of individual memory cells, Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate, Field effect transistors are of course also used in integrated circuitry other than and/or outside of memory circuitry.

DETAILED DESCRIPTION OF EXAMPLE EMBODIMENTS

Figure 1:
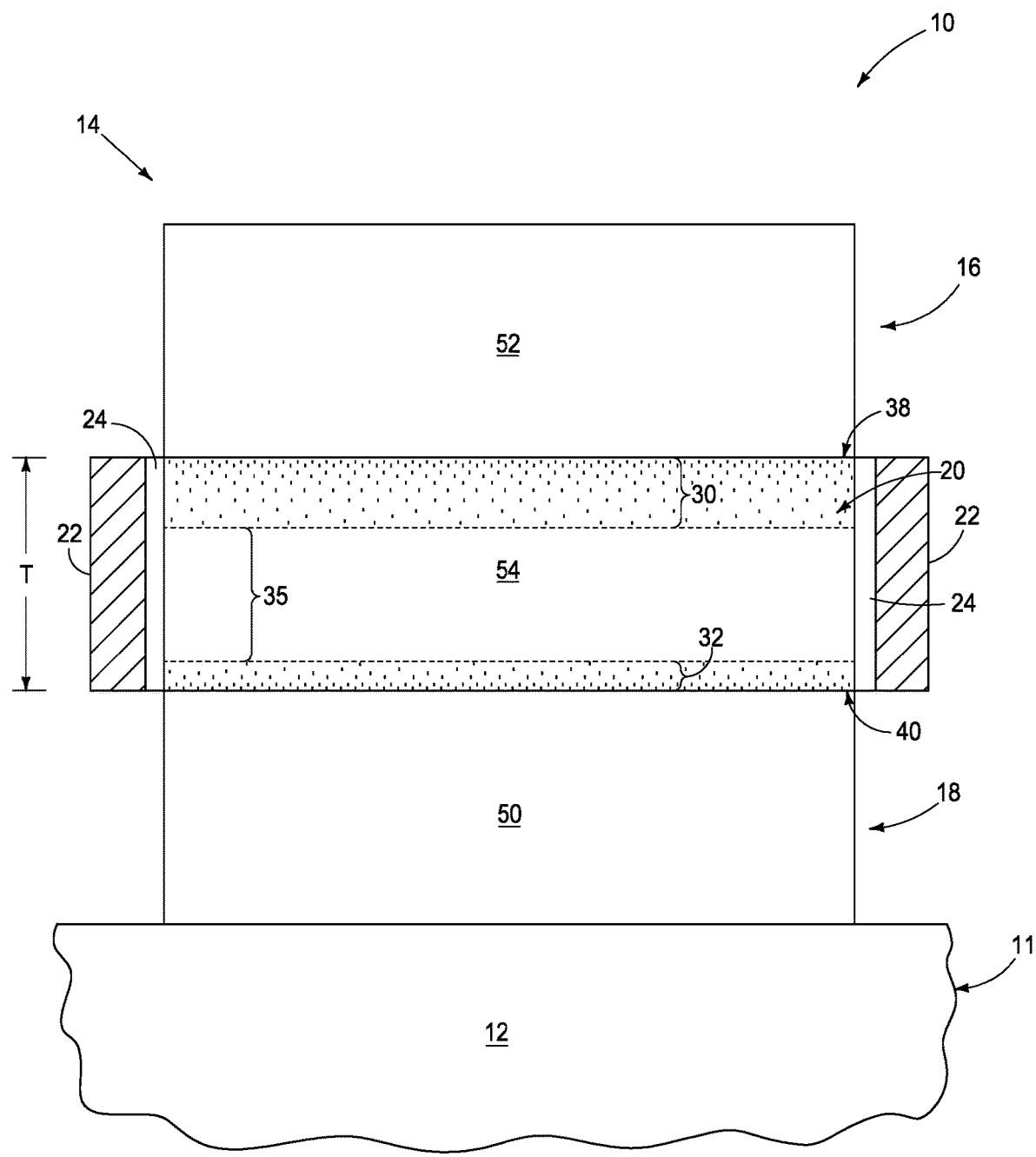
FIG. 1 is a diagrammatic sectional view of a transistor in accordance with an embodiment of the invention.

Embodiments of the invention encompass methods of forming integrated circuitry comprising one or more transistors and one or more transistors independent of method of manufacture. Transistors manufactured in accordance with method embodiments may have any of the attributes as described herein in structure embodiments. A first example transistor 14 in accordance with an embodiment of the invention as part of a construction 10 is shown in FIG. 1. Construction 10 comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Only one transistor 14 is shown, although construction 10 may comprise multiple of the same or different construction transistors, for example fabricated in an array which includes one or more transistors in accordance with the invention.

Transistor 14 comprises a top source/drain region 16, a bottom source/drain region 18, a channel region 20 vertically between top and bottom source/drain regions 16, 18, respectively, and a gate 22 (i.e., conductive material) operatively laterally-adjacent channel region 20. A gate insulator 24 (e.g., silicon dioxide and/or silicon nitride) is between gate 22 and channel region 20. The example depicted components for brevity and clarity are only shown in FIG. 1 as a vertical cross-section. The example source/drain regions and channel regions may be, for example, in the form of coextensive longitudinally elongated lines running into and out of the plane of the page upon which FIG. 1 lies. Alternately, and by way of example only, such may be circular, rectangular, elliptical, triangular, etc. in horizontal cross-section (not shown). Gate insulator 24 and/or gate 22 may peripherally encircle such structures or alternately, by way of example only, be only partially around such structures or only on one lateral-side in vertical cross-section (not shown). Top source/drain region 16 and channel region 20 may be considered as having a top interface 38 and bottom source/drain region 18 and channel region 20 may be considered as having a bottom interface 40. Interfaces 38 and/or 40 are shown as being flat and horizontal, although other oriented interfaces may be used, for example diagonal, a jagged and/or undulating interface, a combination of straight and curved segments, etc. FIG. 1 shows as example embodiment wherein top source/drain region 16 comprises material 52, channel region 20 comprises material 54, and bottom source/drain region comprises material 50. Any of materials 52, 54, and 50 may be undoped or doped with a conductivity-modifying dopant (e.g., phosphorus, arsenic, etc.). Example primary materials for each of materials 52, 54, and 50 include monocrystalline or polycrystalline silicon, including a such materials as a mixture and/or alloy with germanium.

In one embodiment, top source/drain region 16 comprises semiconductor material (e.g., silicon, germanium, gallium, combinations thereof, etc.) having a first conductivity-increasing dopant therein (one or more of phosphorus, arsenic, etc.) at a concentration rendering the semiconductor material of top source/drain region 16 to be conductive. Bottom source/drain region 18 comprises semiconductor material that may be the same or different from that of top source/drain region 16 and has a second conductivity-increasing dopant therein at a concentration that renders the semiconductor material of bottom source/drain region 18 to be conductive (e.g., at least $5 \times 10^{19}$ dopant atoms/cm$^3$). The first and second conductivity-increasing dopants may be compositionally the same or compositionally different relative one another and, regardless, may be of the same or different relative concentrations, including variable concentrations, in top source/drain region 16 and bottom source/drain region 18 relative one another. An upper portion 30 of channel region 20 is adjacent top source/drain region 16 and has a non-conductive concentration of the first conductivity-increasing dopant therein (e.g., no more than at least $1 \times 10^{18}$ dopant atoms/cm$^3$). A lower portion 32 of channel region 20 is adjacent bottom source/drain region 18 and has a non-conductive concentration of the second conductivity-increasing dopant therein, with upper portion 30 being vertically thicker than lower portion 32. In one embodiment, upper portion 30 is no more than 33%, in one embodiment no more than 25%, of vertical thickness T of channel region 20. In one embodiment, upper portion 30 is at least 2.0 times, in one embodiment at least 2.5 times, vertically thicker than lower portion 32.

Concentration of the first conductivity-increasing dopa t iii upper portion 30 of channel region 20 may or may not be constant, with FIG. 1 intending to diagrammatically show an example embodiment wherein such concentration is not constant. Conductivity-increasing dopant in portions 30 and 32 is shown by stippling, with example concentration of the first conductivity-increasing dopant in upper portion 30 decreasing moving vertically deeper into upper portion 30. Analogously, concentration of the second conductivity-increasing dopant in lower portion 32 may or may not be constant, with FIG. 1 diagrammatically showing concentration of the second conductivity-increasing dopant in lower portion 32 not being constant. Second conductivity-increasing dopant in lower portion 32 is diagrammatically shown in lower portion 32 as increasing moving vertically deeper into lower portion 32. An example intervening region 35 is shown vertically between upper portion 30 and lower portion 32. Intervening region 35 may be doped with a dopant of opposite conductivity type to that of dopants in top and bottom source/drain regions 16, 18, respectively, or be undoped. Portions 30, 32, and 35 may be additionally doped with a conductivity-increasing dopant opposite in type (i.e., n vs. p, or p vs. n).

Any other attribute(s) or aspect(s) as shown and/or described herein with respect to other embodiments may be used in the above-described embodiments.

In one embodiment, at least one of top source/drain region 16, bottom source/drain region 18, and channel region 20 is crystalline. In this document, "crystalline" not immediately preceded by a numerical percentage or other quantifying adjective(s) is a material, region, and/or structure that is at least 90% by volume crystalline (i.e., having at least 90% by volume crystal grains). In this document, "amorphous" not immediately preceded by a numerical percentage or other quantifying adjective(s) is a material, region, and/or structure that is at least 90% by volume amorphous. All crystal grains within at least one of the top source/drain region 16, the bottom source/drain region 18, and the channel region 20 have average crystal grain sizes within 0.064 cubic micron ($\mu m^3$) of one another (independent or regardless of aspects described above with respect to upper and lower portions of the channel region), In one such embodiment, such average crystal grain sizes are within 0.027 $\mu m^3$, in one such embodiment within 0.008 $\mu m^3$, of one another. In one embodiment, such average crystal grain sizes of at least a majority, in one embodiment of at least 75%, of all of the crystal grains within the at least one of the top source/drain region 16, the bottom source/drain region 18, and the channel region 20 are within 0.027 $\mu m^3$, in one such embodiment within 0.001 $\mu m^3$, and in one such embodiment within 0.000125 $\mu m^3$, of one another. As one example, such very tight crystal grain size distributions of all crystal grains within a source/drain region and/or channel region may be attained in a vertical transistor by laser annealing as described below. In one embodiment, all of the crystal grains within the at least one of the top source/drain region, the bottom source/drain region, and the channel region individually have a maximum dimension there-through within 0.4 micron ($\mu m$), in one embodiment within 0.3 $\mu m$, and within one embodiment 0.2 $\mu m$, of one another. In one embodiment, all of the crystal grains within the at least one of the top source/drain region, the bottom source/drain region, and the channel region individually have a minimum dimension there-through within 0.4 $\mu m$, in one embodiment within 0.3 $\mu m$, and in one embodiment within 0.2 $\mu m$, of one another. Any other attribute(s) or aspect(s) as shown and/or described herein with respect to other embodiments may be used.

Embodiments of the invention encompass methods as well as a transistor as identified above independent of method of manufacture. Nevertheless, such methods may have any of the attributes as described above in structure embodiments. Likewise, the above-described structure embodiments may incorporate and form any of the attributes described below with respect to method embodiments. Example methods may be used in forming integrated circuitry and are described with reference to FIGS. 2-6. Like numerals for predecessor constructions have been used where appropriate.

Figure 2:
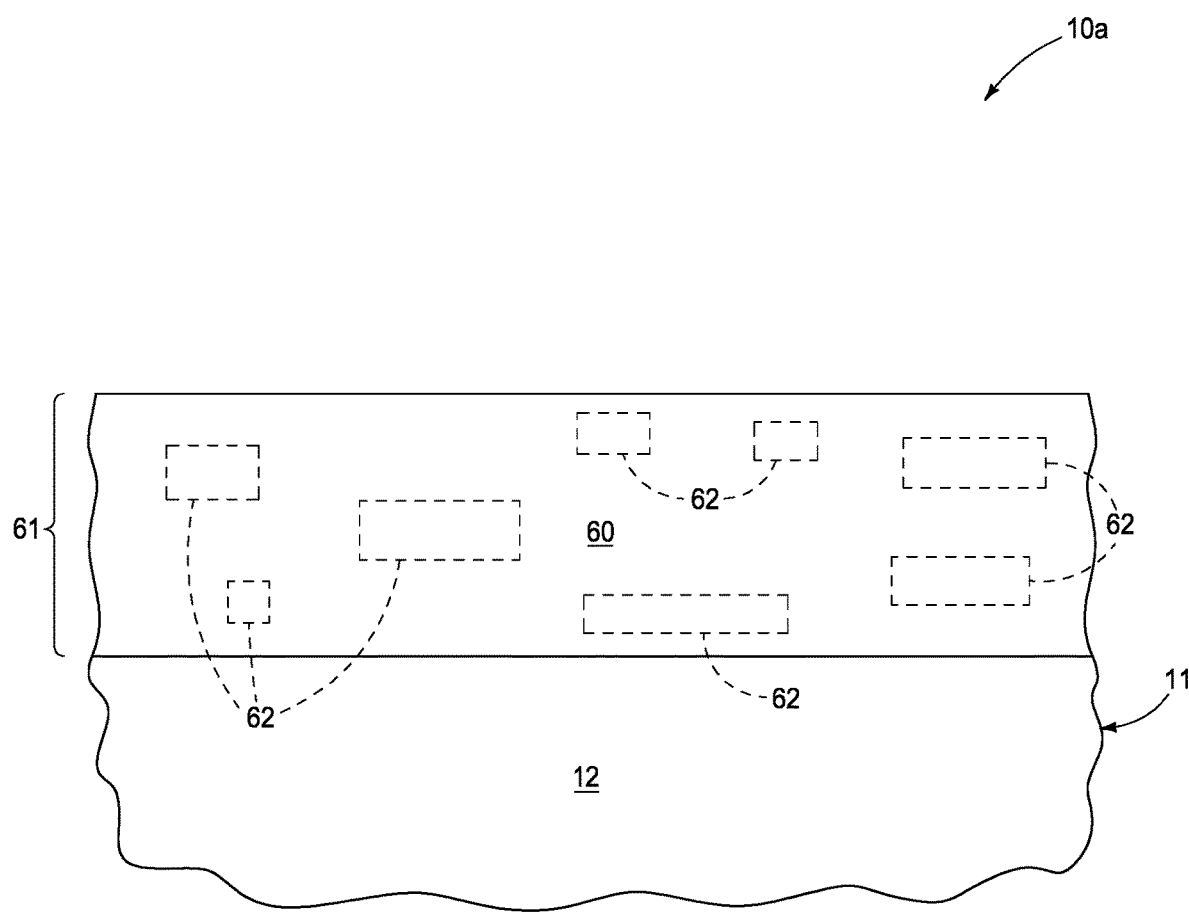
FIG. 2 is a diagrammatic cross-sectional view of a portion of a substrate construction in process in accordance with an embodiment of the invention.

Referring to FIG. 2, operative circuit components 62 have been formed above substrate 11. Such are diagrammatically shown as being encompassed within material 60 which may be any one or combination of insulative, conductive, and semiconductive materials. Any existing or future-developed operative circuit components 62 may be fabricated, with transistors, capacitors, diodes, resistors, amplifiers, rectifiers, etc. being examples. In one embodiment, at least some of operative circuit components 62 are formed to comprise lower transistors, with "lower" being used as an elevational position adjective to distinguish such transistors from other transistors formed there-above as will be apparent from the continuing discussion. In one such embodiment, such lower transistors individually comprise a lower top source/drain region, a lower bottom source/drain region, a lower channel region vertically between the lower top and bottom source/drain regions, and a lower gate operatively laterally-adjacent the lower channel region. For example, and by way of example only, such lower transistors may have any of the attributes as described above or otherwise. In one such embodiment, the forming of such lower transistors comprises laser annealing material from which at least one of the individual lower top source/drain region, the lower bottom source/drain region, and the lower channel region is made.

In some embodiments, operative circuit components 62 may be considered as having been formed relative to a stack or deck 61, and in one embodiment that may include multiple tiers of components that may be vertically separated by insulative material.

Figure 3:
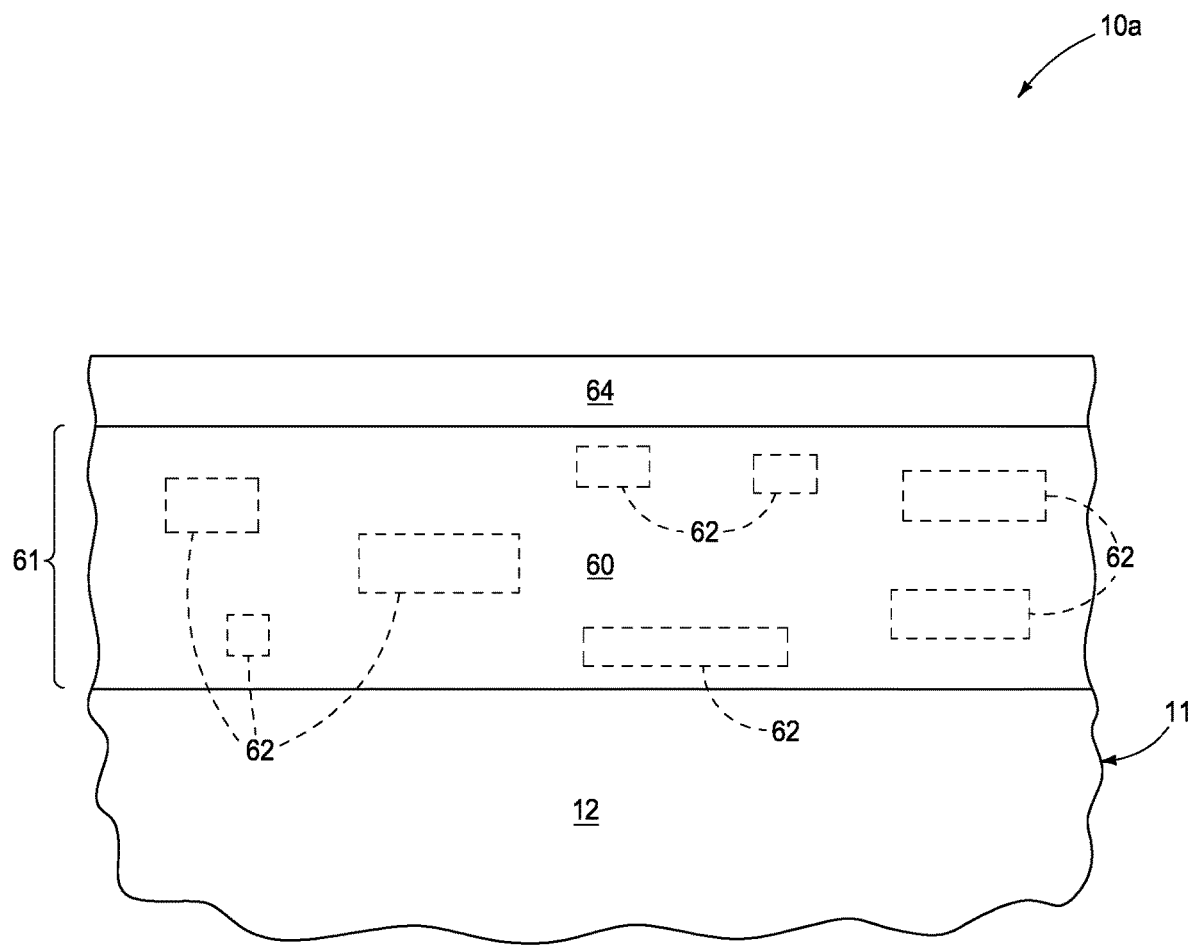
FIGS. 3-6 are diagrammatic sequential cross-sectional views of the construction of FIG. 2 in process in accordance with one or more embodiments of the invention.

Referring to FIG. 3, an insulator material 64 (e.g., comprising one or more of silicon dioxide, silicon nitride, aluminum oxide, etc.) has been formed directly above operative circuit components 62. In one embodiment, insulator material 64 has a minimum thickness of no less than 1,000 Angstroms, in one embodiment no less the 2,000 Angstroms, and in one embodiment of 2,000 Angstroms to 5,000 Angstroms. Insulator material 64 may be homogenous. Alternately, insulator material may include one or more regions, layers, etc. that comprise conductive and/or semiconductive material as long as material 64 is overall insulative.

Figure 4:
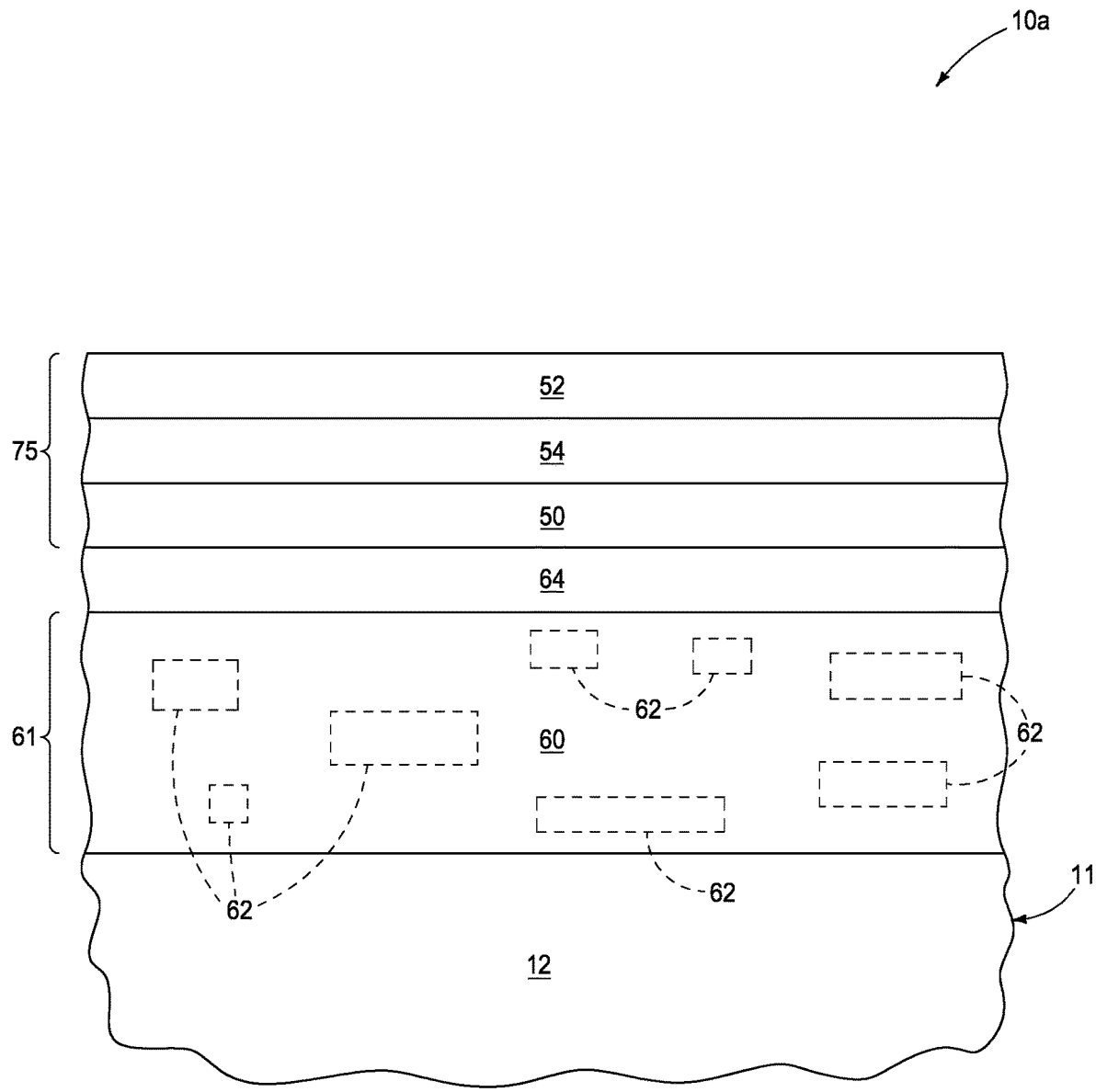

Referring to FIG. 4, a bottom material 50, a top material 52, and a middle material 54 vertically between bottom material 50 and top material 52 have been formed directly above insulator material 64. The bottom, top, and middle materials respectively comprise a bottom source/drain region, a top source/drain region, and a channel region vertically between the bottom and top source/drain regions in a finished construction of a transistor being formed that will be directly above insulator material 64. At least bottom material 50 and top material 52 comprise conductivity-increasing dopant therein in the finished construction of the transistor. Example materials 50, 52, and 54 are shown as being blanketing layers atop insulator material 64. Such may be patterned at this point in processing, or later, to have an example outline of materials 52, 54, and 50 of FIG. 1, or otherwise. Regardless, materials 52, 54, and 50 may be considered as a having been formed relative to a stack or deck 75, and in one embodiment that may include multiple tiers of components that may be vertically separated by insulative material (not shown).

Figure 5:
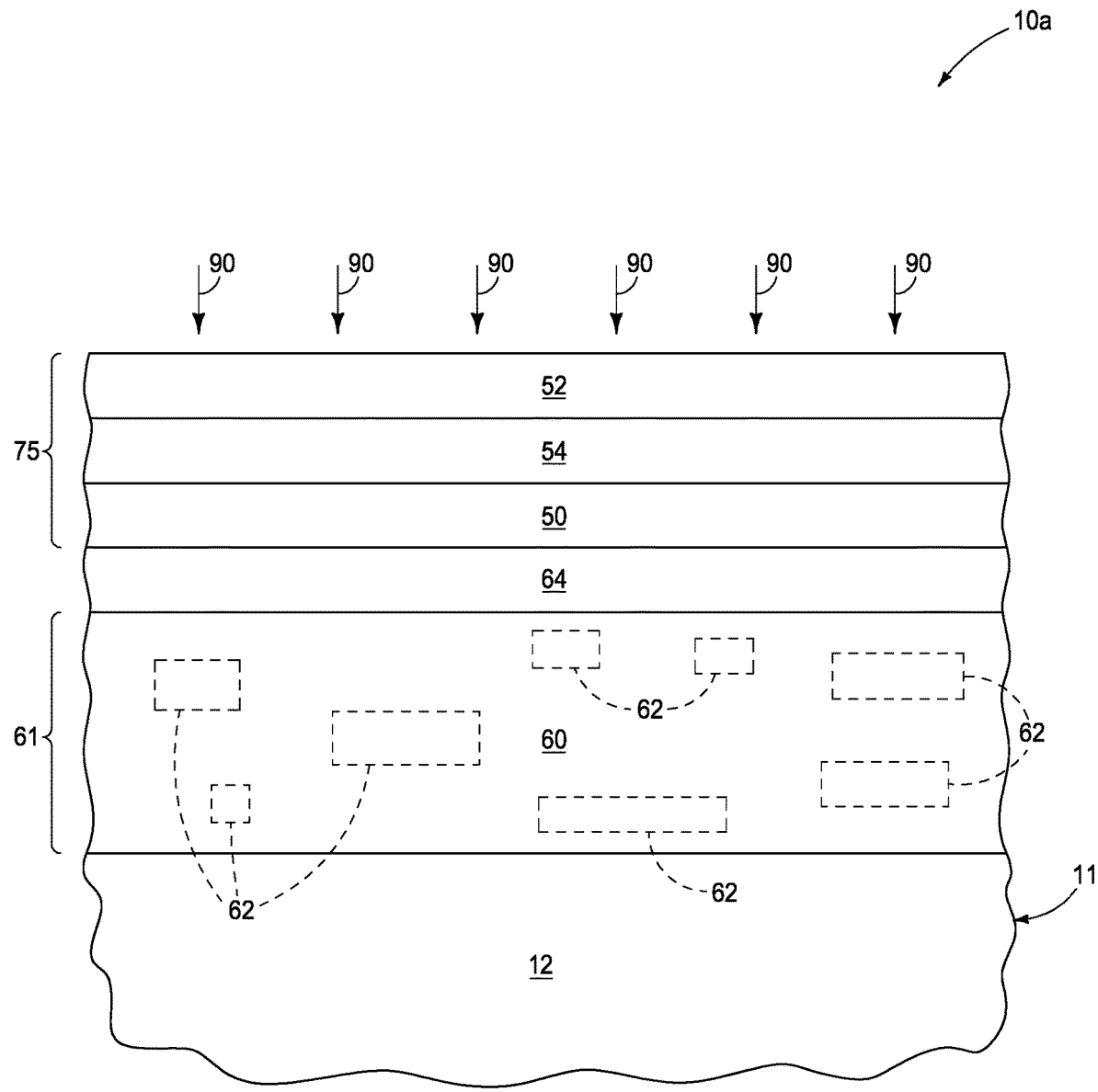

Referring to FIG. 5, laser annealing (e.g., depicted by vertically-downward-directed arrows 90) is conducted of at least one of the bottom, top, and middle materials to melt and then crystallize at least one of the bottom, top, and middle materials to be crystalline. FIG. 5, by way of example only, shows the laser annealing occurring after all of materials 50, 52, and 54 have been deposited and thereby at least with respect to top material 52, although such may also occur with respect to just material 52, just materials 52 and 54, or to all of materials 52, 54, and 50. Alternately or additionally, one or more of middle material 54 and bottom material 50 could be laser annealed prior to depositing any material thereover, Regardless, the laser annealing activates the conductivity-increasing dopant that is in the at least one of the bottom, top, and middle materials (i.e., over the period of time that includes both the melting and crystallizing). In one embodiment, at least some of the melting and at least some of the activating during the laser annealing occur at the same time. In one such embodiment, at least most of the activating occurs during the melting. Regardless, insulator material 64 that is vertically between operative circuit components 62 and bottom material 50 shields operative circuit components 62 there-below from heat generated during the laser annealing that would otherwise render operative circuit components 62 to become circuit inoperative. The artisan may select suitable insulator materials (e.g., one or more of silicon dioxide, silicon nitride, aluminum oxide, etc.) and thickness and thereof to achieve such heat-shielding effect, with a minimum thickness for material 64 expected to be between 2,000 Angstroms to 5,000 Angstroms in many embodiments. The act of laser annealing, in some embodiments, forms materials 52, 54, and 50 to have any one or more of the attributes described above with respect to such materials as shown and described relative to transistor 14 of FIG. 1.

By way of examples only, the laser annealing may use a wavelength between 200 and 700 nanometers, power at 0.1 to 2 J/cm$^2$ (ideally, 0.5 to 2 J/cm$^2$), pulse width 5 to 250 nanoseconds, number of laser shots 1 to 100, and substrate temperature from room temperature to 450° C. Laser power for any anneal can be varied as selected by the artisan to control surface roughness of interfaces and grain size of the layer(s) being laser annealed. Additionally, substrate temperature may be varied for different laser shots, as may laser power and/or pulse width. The laser annealing may render the material that is annealed to be molten. Any material(s) being laser annealed immediately-prior to such laser annealing may be doped to different concentrations. Regardless, the annealing activates conductivity-increasing dopant present in the at least one of materials 52, 54, and 50.

Figure 6:
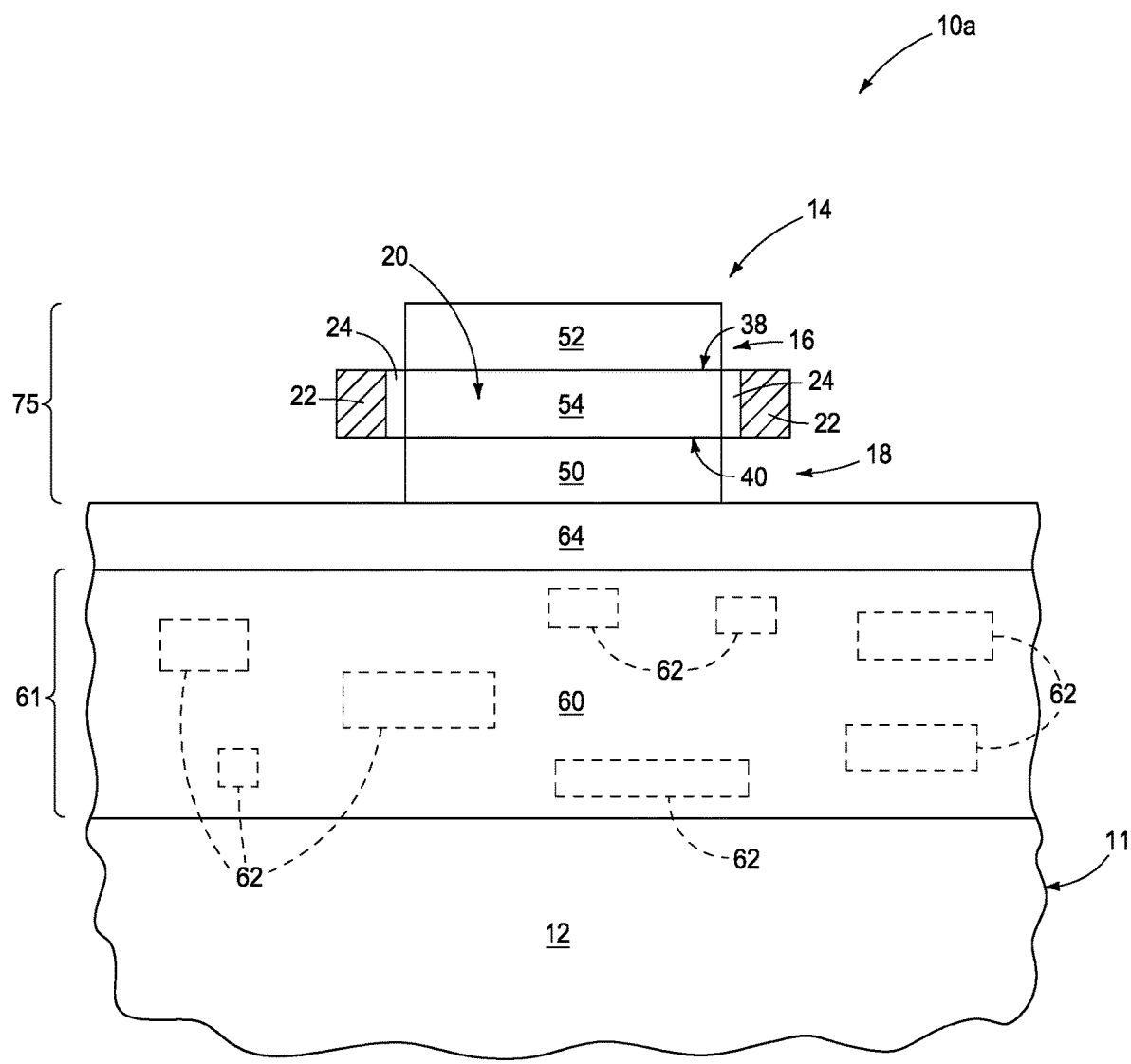

Referring to FIG. 6, materials 52, 54, and 50 are shown as having been patterned to produce an example construction like that largely shown in FIG. 1. Thereafter, a gate insulator 24 and a gate 22 have been formed laterally-adjacent middle material 54.

Any other attribute(s) or aspect(s) as shown and/or described herein with respect to other embodiments may be used.

The above processing(s) or construction(s) may be considered as being relative to an array of components formed as or within a single stack or single deck (or two stacks or two decks) of components above or as part of an underlying base substrate (albeit, the single or two stack(s)/deck(s) may individually have multiple tiers), Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the arrays) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers), Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any, of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down"

are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material, "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a transistor comprises a top source/drain region, a bottom source/drain region, a channel region vertically between the top and bottom source/drain regions, and a gate operatively laterally-adjacent the channel region. At least one of the top source/drain region, the bottom source/drain region, and the channel region are crystalline. All crystal grains within the at least one of the top source/drain region, the bottom source/drain region, and the channel region have average crystal sizes within 0.064 μm³ of one another.

In some embodiments, a transistor comprising a top source/drain region has a first conductivity-increasing dopant therein at a concentration rendering semiconductor material of the top source/drain region to be conductive. A bottom source/drain region has a second conductivity-increasing dopant therein at a concentration rendering semiconductor material of the bottom source/drain region to be conductive. A channel region is vertically between the top and bottom source/drain regions. A gate is operatively laterally-adjacent the channel region. An upper portion of the channel region is adjacent the top source/drain region and has a non-conductive concentration of the first conductivity-increasing dopant therein. A lower portion of the channel region is adjacent the bottom source/drain region and has a non-conductive concentration of the second conductivity-increasing dopant therein. The upper portion is vertically thicker than the lower portion.

In some embodiments, a method of forming integrated circuitry comprises forming operative circuit components above a substrate. An insulator material is formed directly above the operative circuit components. A bottom material, a top material, and a middle material vertically between the bottom and top materials are formed directly above the insulator material. The bottom, top, and middle materials, respectively, comprise a bottom source/drain region, a top source/drain region, and a channel region vertically between the bottom and top source/drain regions in a finished construction of a transistor that will be directly above the insulator material. At least the bottom and the top materials comprise conductivity-increasing dopant therein in the finished construction of the transistor. At least one of the bottom, top, and middle materials are laser annealed to melt and then crystallize the at least one of the bottom, top, and middle materials to be crystalline. The laser annealing activates the conductivity-increasing dopant that is in the at least one of the bottom, top, and middle materials. The insulator material that is vertically between the operative circuit components and the bottom material shield the operative circuit components there-below from heat generated during the laser annealing that would otherwise render the operative circuit components to become circuit inoperative. A gate insulator and a gate are formed laterally-adjacent the middle material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming integrated circuitry, comprising: forming operative circuit components above a substrate; forming an insulator material directly above the operative circuit components; forming a bottom material, a top material, and a middle material vertically between the bottom and top materials directly above the insulator material; the bottom, top, and middle materials respectively comprising a bottom source/drain region, a top source/drain region, and a channel region vertically between the bottom and top source/drain regions in a finished construction of a transistor that will be directly above the insulator material; at least the bottom and the top materials comprising conductivity-increasing dopant therein in the finished construction of the transistor; laser annealing at least one of the bottom, top, and middle materials to melt and then crystallize the at least one of the bottom, top, and middle materials to be crystalline; the laser annealing activating the conductivity-increasing dopant that is in the at least one of the bottom, top, and middle materials; the insulator material that is vertically between the operative circuit components and the bottom material shielding the operative circuit components there-below from heat generated during the laser annealing that would otherwise render the operative circuit components to become circuit inoperative; and forming a gate insulator and a gate laterally-adjacent the middle material.

2. The method of claim 1 wherein at least some of the melting and at least some of the activating during the laser annealing occur at the same time.

3. The method of claim 2 wherein at least most of the activating occurs during the melting.

4. The method of claim 1 wherein the laser annealing comprises multiple laser shots individually comprising a pulse width of 5 to 250 nanoseconds.

5. The method of claim 1 wherein the laser annealing forms all crystal grains within the at least one of the top source/drain region, the bottom source/drain region, and the channel region to have an average crystal size within 0.064 μm³ of one another.

6. The method of claim 1 wherein,
the top source/drain region has a first conductivity-increasing dopant therein at a concentration rendering semiconductor material of the top source/drain region to be conductive;
the bottom source/drain region has a second conductivity-increasing dopant therein at a concentration rendering semiconductor material of the bottom source/drain region to be conductive; and
the laser annealing:
is at least of the top source/drain region;
forms an upper portion of the channel region adjacent the top source/drain region to have a non-conductive concentration of the first conductivity-increasing dopant therein; and
forms a lower portion of the channel region adjacent the bottom source/drain region to have a non-conductive concentration of the second conductivity-increasing dopant therein, the upper portion being vertically thicker than the lower portion.

7. The method of claim 1 wherein the insulator material has a minimum thickness of no less than 1,000 Angstroms.

8. The method of claim 7 wherein the insulator material has a minimum thickness of no less than 2,000 Angstroms.

9. The method of claim 8 wherein the insulator material has a minimum thickness of 2,000 Angstroms to 5,000 Angstroms.

10. The method of claim 1 wherein the insulator material comprises silicon dioxide.

11. The method of claim 1 wherein the insulator material comprises silicon nitride.

12. The method of claim 1 comprising forming at least some of the operative circuit components to comprise lower transistors individually comprising a lower top source/drain region, a lower bottom source/drain region, a lower channel region vertically between the lower top and bottom source/drain regions, and a lower gate operatively laterally-adjacent the lower channel region.

13. The method of claim 12 wherein forming the lower transistors comprises laser annealing material from which at least one of the individual lower top source/drain region, the lower bottom source/drain region, and the lower channel region is made.

* * * * *